(12) United States Patent
Lee et al.

(10) Patent No.: US 7,573,095 B2
(45) Date of Patent: Aug. 11, 2009

(54) MEMORY CELLS WITH IMPROVED PROGRAM/ERASE WINDOWS

(75) Inventors: Tzyh-Cheang Lee, Hsinchu (TW); Fu-Liang Yang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 83 days.

(21) Appl. No.: 11/633,719

(22) Filed: Dec. 5, 2006

(65) Prior Publication Data
US 2008/0128791 A1 Jun. 5, 2008

(51) Int. Cl.
*H01L 27/115* (2006.01)
(52) U.S. Cl. .................. 257/326; 257/341; 257/335; 257/314; 257/315; 257/321; 257/E21.683; 257/E21.691; 438/278
(58) Field of Classification Search .......... 257/335, 257/314, 321, 336, 408, E21.683, E21.691; 438/278
See application file for complete search history.

(56) References Cited

U.S. PATENT DOCUMENTS

| | | | |
|---|---|---|---|
| 5,094,967 A * | 3/1992 | Shinada et al. | 438/258 |
| 5,953,255 A | 9/1999 | Lee | |
| 5,998,828 A * | 12/1999 | Ueno et al. | 257/315 |
| 6,066,894 A * | 5/2000 | Yokozeki | 257/754 |
| 6,862,251 B2 | 3/2005 | Yaoi et al. | |
| 6,897,543 B1 | 5/2005 | Huang et al. | |
| 7,046,570 B1 | 5/2006 | Hubbard | |
| 7,084,452 B2 | 8/2006 | Kim | |
| 2005/0247975 A1 * | 11/2005 | Kim | 257/336 |

OTHER PUBLICATIONS

Fukuda, M., et al., "Scaled 2 bIt/cell SONOS Type Nonvolatile Memory Technology for sub-90nm Embedded Application using SiN Sidewall Trapping Structure," 2003 IEEE, IEDM 03, pp. 909-912.

* cited by examiner

*Primary Examiner*—Sue Purvis
*Assistant Examiner*—Tucker Wright
(74) *Attorney, Agent, or Firm*—Slater & Matsil, L.L.P.

(57) ABSTRACT

A semiconductor structure includes a memory cell in a first region and a logic MOS device in a second region of a semiconductor substrate. The memory cell includes a first gate electrode over the semiconductor substrate; a first gate spacer on a sidewall of the first gate electrode, wherein the first gate spacer comprises a storage on a tunneling layer; and a first lightly-doped source or drain (LDD) region and a first pocket region adjacent to the first gate electrode. The logic MOS device includes a second gate electrode on the semiconductor substrate; a second gate spacer on a sidewall of the second gate electrode; a second LDD region and a second pocket region adjacent the second gate electrode, wherein at least one of the first LDD region and the first pocket region has a higher impurity concentration than a impurity concentration of the respective second LDD region and the second pocket region.

13 Claims, 9 Drawing Sheets

MEMORY CELLS WITH IMPROVED PROGRAM/ERASE WINDOWS

TECHNICAL FIELD

This invention relates generally to semiconductor devices, and more particularly to the structure and fabrication methods of memory cells.

BACKGROUND

In the field of data storage, there are two main types of storage elements. The first type is volatile memories, in which information is stored in a particular storage element and the information is lost the instant the power is removed from the circuit. The second type is non-volatile memories, in which the information is preserved even when the power is removed. Typically, the manufacturing techniques used to form non-volatile memories are different from standard logic processes.

Non-volatile memories further include one-time-programmable (OTP) memories and flash memories, which can be programmed and erased more than once. Traditionally, fuses or anti-fuses are used as OTP memories. Recently, metal-oxide-semiconductor (MOS) devices are increasingly used as OTP memories, wherein charges are stored in MOS devices to represent states.

FIG. 1 illustrates a conventional memory cell used as a one-time-programmable memory cell. The memory cell includes two gate spacers, each including a storage layer 8, which is separated from substrate 2 and gate electrode 4 by tunneling layer 6. The charges stored in storage layer 8 affects the threshold voltage of the memory cell. Therefore, by determining the threshold voltage of the memory cell, the state of the memory cell can be determined.

For OTP memories cells to represent the state correctly, a reasonable program/erase window, which is the difference between a threshold voltage of a memory cell having charges stored in storages and a threshold voltage of the memory cell not having charges stored in storages, is needed. If the program/erase window is too low, the reliability of the memory cell will be adversely affected. A memory cell provided by the present invention addresses this requirement.

SUMMARY OF THE INVENTION

In accordance with one aspect of the present invention, a semiconductor structure is provided. The semiconductor structure includes a semiconductor substrate, which includes a first region and a second region, and a memory cell in the first region. The memory cell comprises a first gate electrode over the semiconductor substrate and a first gate spacer on a sidewall of the first gate electrode, wherein the first gate spacer comprises a storage on a tunneling layer. A first lightly doped source or drain (LDD) region is formed in the semiconductor substrate and having at least a portion under the first gate spacer. A first pocket region is formed in the semiconductor substrate and adjacent to the first LDD region. The semiconductor structure further includes a logic metal-oxide-semiconductor (MOS) device in the second region. The logic MOS device includes a second gate electrode over the semiconductor substrate. A second gate spacer is formed on a sidewall of the second gate electrode. A second LDD region is formed in the semiconductor substrate, wherein the second LDD region has at least a portion under the second gate spacer. A second pocket region is formed in the semiconductor substrate and adjacent to the second LDD region, wherein at least one of the first LDD region and the first pocket region has a higher impurity concentration than an impurity concentration of the respective second LDD region and the second pocket region.

In accordance with another aspect of the present invention, a semiconductor structure includes a semiconductor substrate comprising a first region and a second region, and a memory cell in the first region. The memory cell includes a first gate electrode on the semiconductor substrate and a first gate spacer on a sidewall of the first gate electrode, wherein the first gate spacer comprises a storage on a tunneling layer. A first source/drain extension region is formed in the semiconductor substrate and adjacent to the first gate electrode, wherein the first source/drain extension region has a first impurity concentration. A first deep source/drain region is formed in the semiconductor substrate and adjoining the first source/drain extension region. The semiconductor structure further includes a logic MOS device in the second region, wherein the logic MOS device includes a second gate electrode on the semiconductor substrate, and wherein the first and the second gate electrodes are separate portions of a same gate electrode layer. A second gate spacer is formed on a sidewall of the second gate electrode, wherein the first and the second gate spacers have substantially a same thickness. A second source/drain extension region is formed in the semiconductor substrate and adjacent to the second gate electrode, wherein the second source/drain extension region has a second impurity concentration, and wherein the first impurity concentration is greater than the second impurity concentration. A second deep source/drain region is formed in the semiconductor substrate and adjoining the second source/drain extension region, wherein the first and the second deep source/drain regions comprise a same impurity with substantially the same impurity concentrations.

In accordance with yet another aspect of the present invention, a method of forming a semiconductor structure includes providing a semiconductor substrate comprising a first region and a second region, wherein the first region is a memory cell region and the second region is a logic MOS device region, and simultaneously forming a first gate electrode in the first region and a second gate electrode in the second region, wherein the first and the second gate electrodes are on the semiconductor substrate. The method further includes simultaneously forming a first gate spacer on a sidewall of the first gate electrode and a second gate spacer on a sidewall of the second gate electrode, wherein the first and the second gate spacers each comprise a storage on a tunneling layer. A first source/drain extension region is formed in the semiconductor substrate and adjacent to the first gate electrode. A second source/drain extension region is then formed in the semiconductor substrate and adjacent to the second gate electrode, wherein a first impurity concentration in the first source/drain extension region is greater than a second impurity concentration in the second source and drain extension region. The method further includes simultaneously forming a first deep source/drain region in the semiconductor substrate and adjoining the first source/drain extension region, and a second deep source/drain region in the semiconductor substrate and adjoining the second source/drain extension region.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The intermediate stages of manufacturing a preferred embodiment of the present invention, which combines the formation of a memory cell and a logic metal-oxide-semiconductor (MOS) device, are illustrated. Throughout the various views and illustrative embodiments of the present invention, like reference numbers are used to designate like elements.

Figure 1:
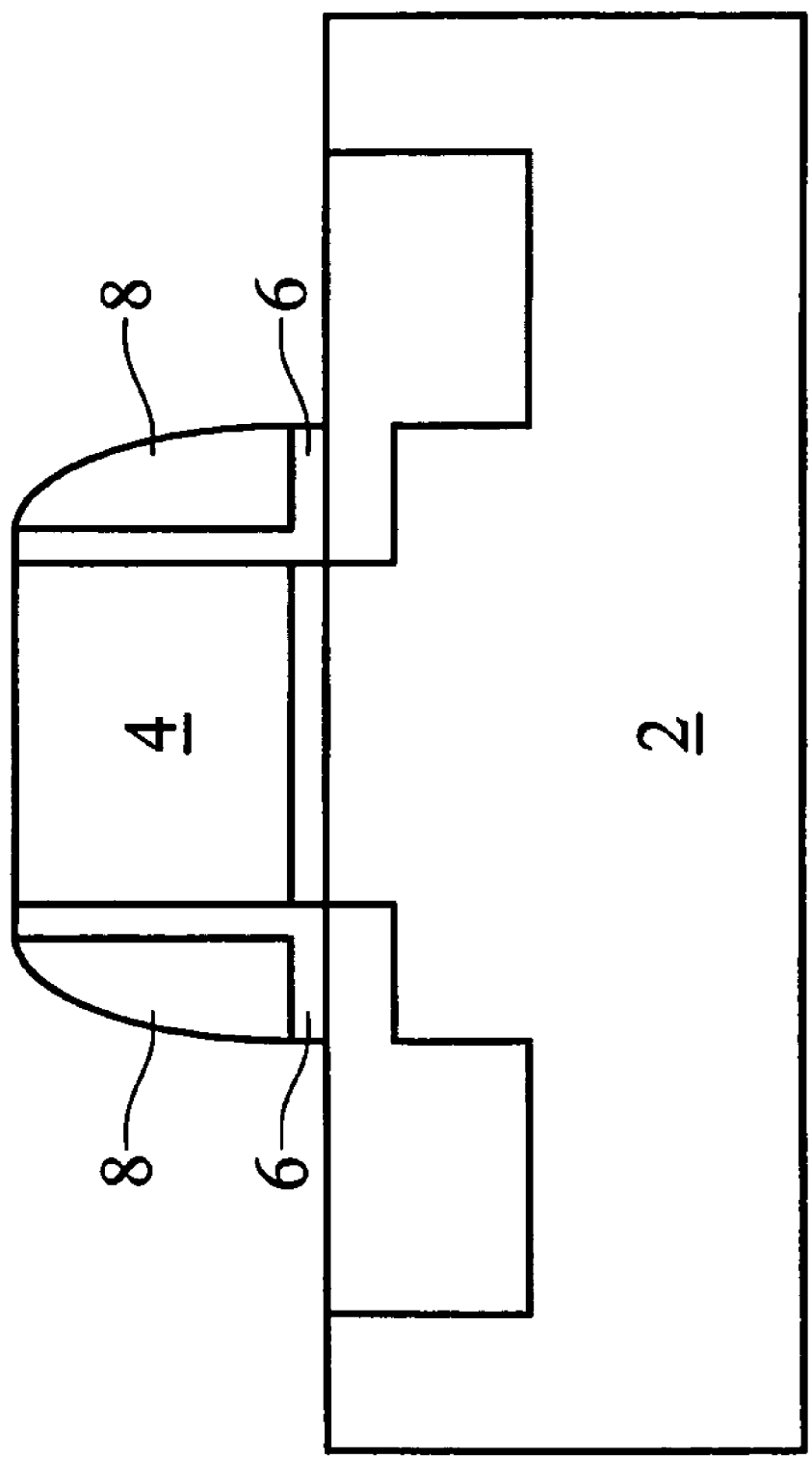
FIG. 1 illustrates a conventional memory cell, wherein charges are stored in gate spacers.
Figure 2:
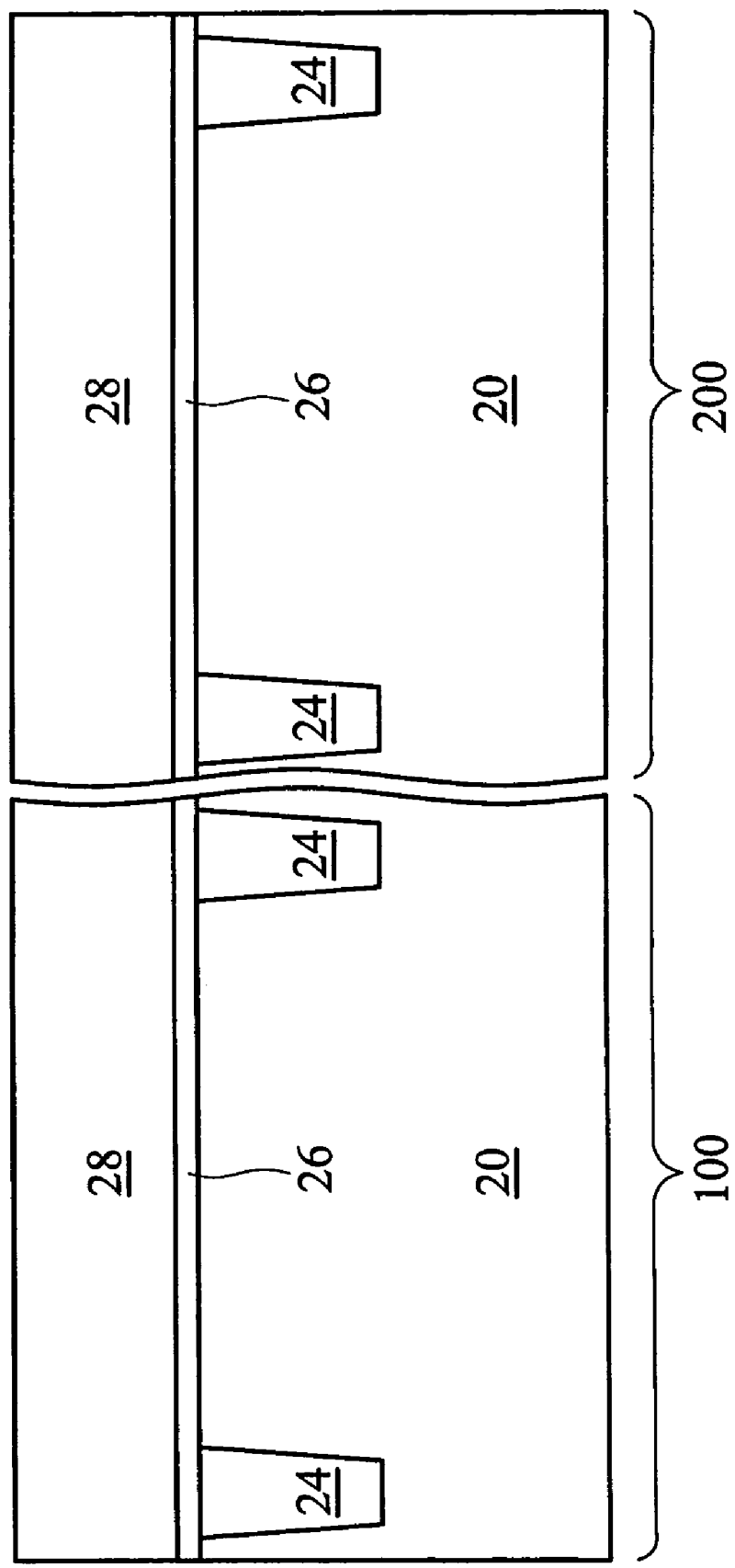
FIGS. 2 through 7 are cross-sectional views of intermediate stages in the manufacturing of an embodiment of the present invention, wherein a memory cell and a logic MOS device are formed.

FIG. 2 illustrates a substrate 20, which includes a memory region 100 and a logic device region 200. Substrate 20 preferably comprises bulk silicon, although other commonly used structures and materials such as silicon-on-insulator (SOI) and silicon alloys can be used. Substrate 20 is preferably lightly doped. For illustration purposes, the subsequently formed memory cell is shown as between shallow trench isolation (STI) regions 24. One skilled in the art will realize, however, that memory cells may be connected in series, and thus it is likely that no STI regions are formed between memory cells. Logic device region 200 is preferably a core device region, and thus the MOS device formed in subsequently discussed steps is a core device.

Referring again to FIG. 2, a gate dielectric layer 26 is formed on substrate 20. In the preferred embodiment, gate dielectric layer 26 has a high dielectric constant (k value), preferably greater than about 3.9. Gate dielectric layer 26 preferably comprises silicon oxides, silicon nitrides, oxynitrides or metal oxides, such as $HfO_2$, $HfZrO_x$, $HfSiO_x$, $HfTiO_x$, $HfAlO_x$, and the like.

Gate electrode layer 28 is formed on gate dielectric layer 26. In one embodiment, gate electrode layer 28 comprises polysilicon. Alternatively, gate electrode layer 28 comprises other commonly used conductive materials such as metals, metal nitrides, metal silicides, and combinations thereof. The preferred methods for forming gate dielectric layer 26 and gate electrode layer 28 include chemical vapor deposition (CVD) techniques such as low temperature CVD (LTCVD), low pressure CVD (LPCVD), rapid thermal CVD (RTCVD), plasma enhanced CVD (PECVD), and other commonly used methods such as sputtering, physical vapor deposition (PVD), and the like.

Figure 3:
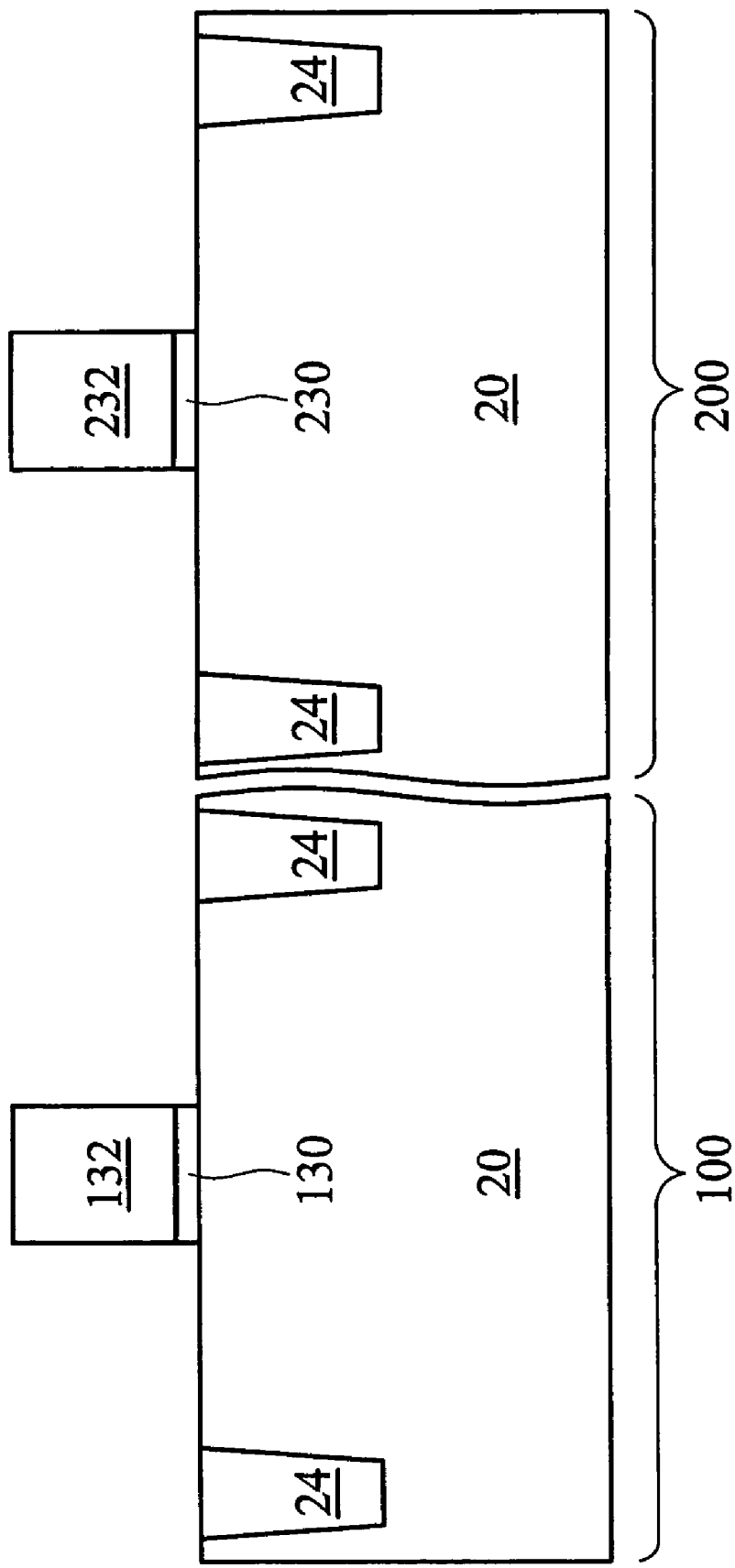

FIG. 3 illustrates the formation of gate stacks. Gate dielectric layer 26 and gate electrode layer 28 are patterned to form a gate stack in memory region 100, which includes gate dielectric 130 and gate electrode 132, and a gate stack in logic device region 200, which includes gate dielectric 230 and gate electrode 232.

Figure 4:
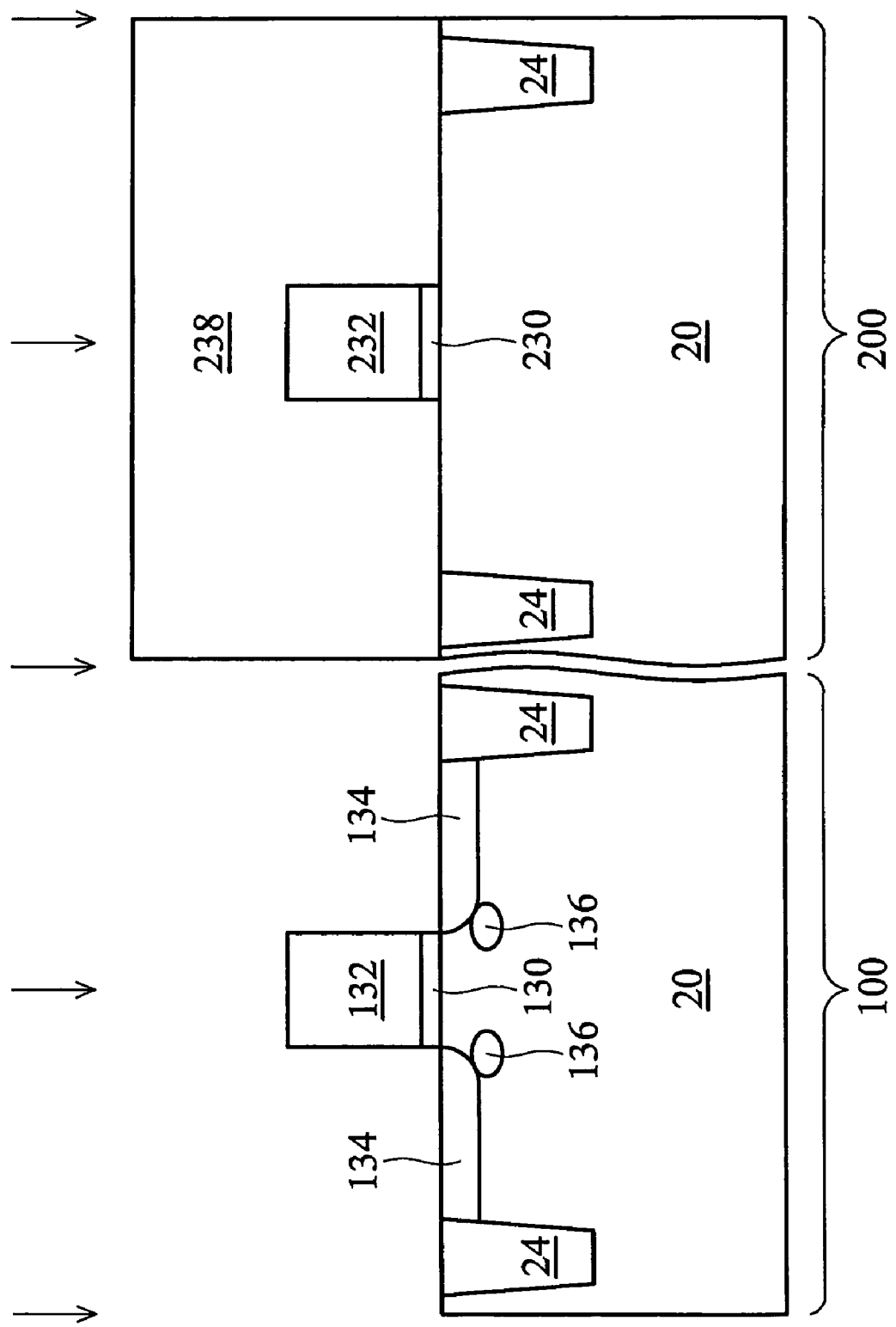
Figure 5:
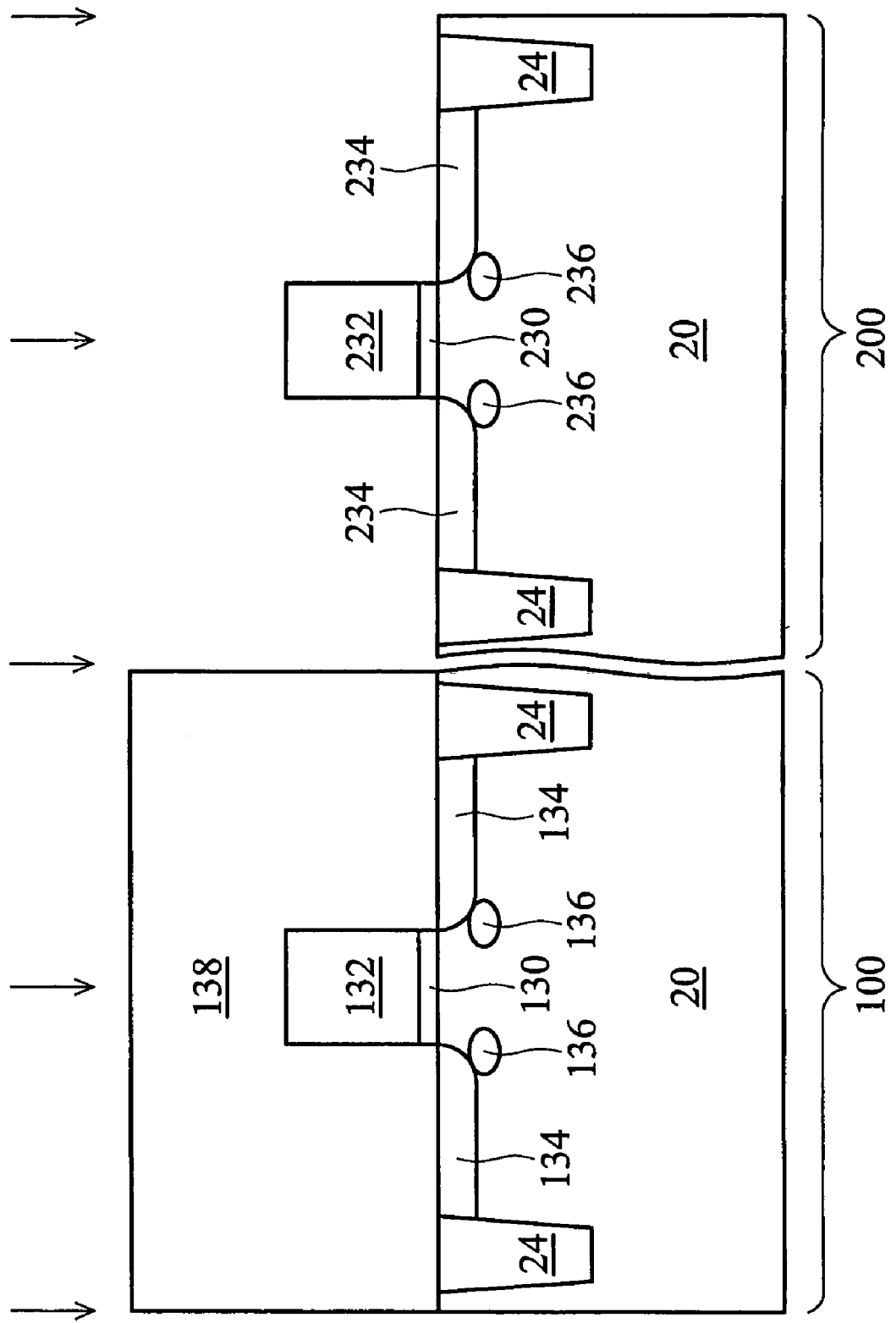

A first embodiment of the present invention is shown in FIGS. 4 and 5. FIG. 4 illustrates the formation of lightly doped source/drain (LDD) regions 134, wherein LDD regions are often referred to as source and drain extension regions. In one embodiment, pocket regions 136 are also formed. Photoresist 238 is formed to mask region 200, and an implantation is performed to introduce n-type impurities, such as phosphorous and/or arsenic, into region 100. The implantation is preferably vertical so that LDD regions 134 are formed substantially aligned with the edges of gate electrode 132. Pocket regions 136 are preferably formed by tilt implanting p-type impurities, such as boron and/or indium. In an exemplary embodiment, pocket regions 136 have a p-type impurity concentration of greater than about $5E18/cm^3$. More preferably, the p-type impurity concentration is between about $5E18/cm^3$ and about $8E18/cm^3$. Photo resist 238 is then removed.

FIG. 5 illustrates the formation of LDD regions 234 and pocket regions 236. Photoresist 138 is formed to cover regions 100. An implantation is performed to introduce n-type impurities into region 200. Pocket regions 236 are then formed by implanting p-type impurities, such as boron and/or indium. In an exemplary embodiment, pocket regions 236 have a p-type impurity concentration of greater than about $2E18/cm^3$, and more preferably between about $2E18/cm^3$ and about $4E18/cm^3$. Photoresist 138 is then removed.

Preferably, a ratio of the p-type impurity concentration in pocket regions 136 to the p-type impurity concentration in pocket regions 236 is greater than 1, and more preferably greater than about 1.5, and more preferably greater than about 2. In another embodiment, a ratio of the impurity concentration in the source and drain extension regions 134 to the impurity concentration in the source and drain extension regions 234 is preferably greater than 1, and more preferably greater than about 1.5, and even more preferably greater than about 2.0. That means, the impurity concentrations in at least one of the LDD regions 134 and the pocket regions 136 to the respective impurity concentrations in the respective LDD regions 234 and pocket regions 236 are preferably greater than 1, and more preferably greater than about 1.5, and even more preferably greater than about 2.0.

In a second embodiment for forming LDD regions 134 and 234 and pocket regions 136 and 236, regions 100 and 200 are both exposed, and LDD regions 134 and 234 are simultaneously formed by a same implantation process. Pocket regions 136 and 236 are also simultaneously formed. A photoresist, which is similar to photoresist 238 as shown in FIG. 4, is then formed to mask region 200. An additional pocket implantation may then be performed to increase the impurity concentration in pocket regions 136.

Figure 6A:
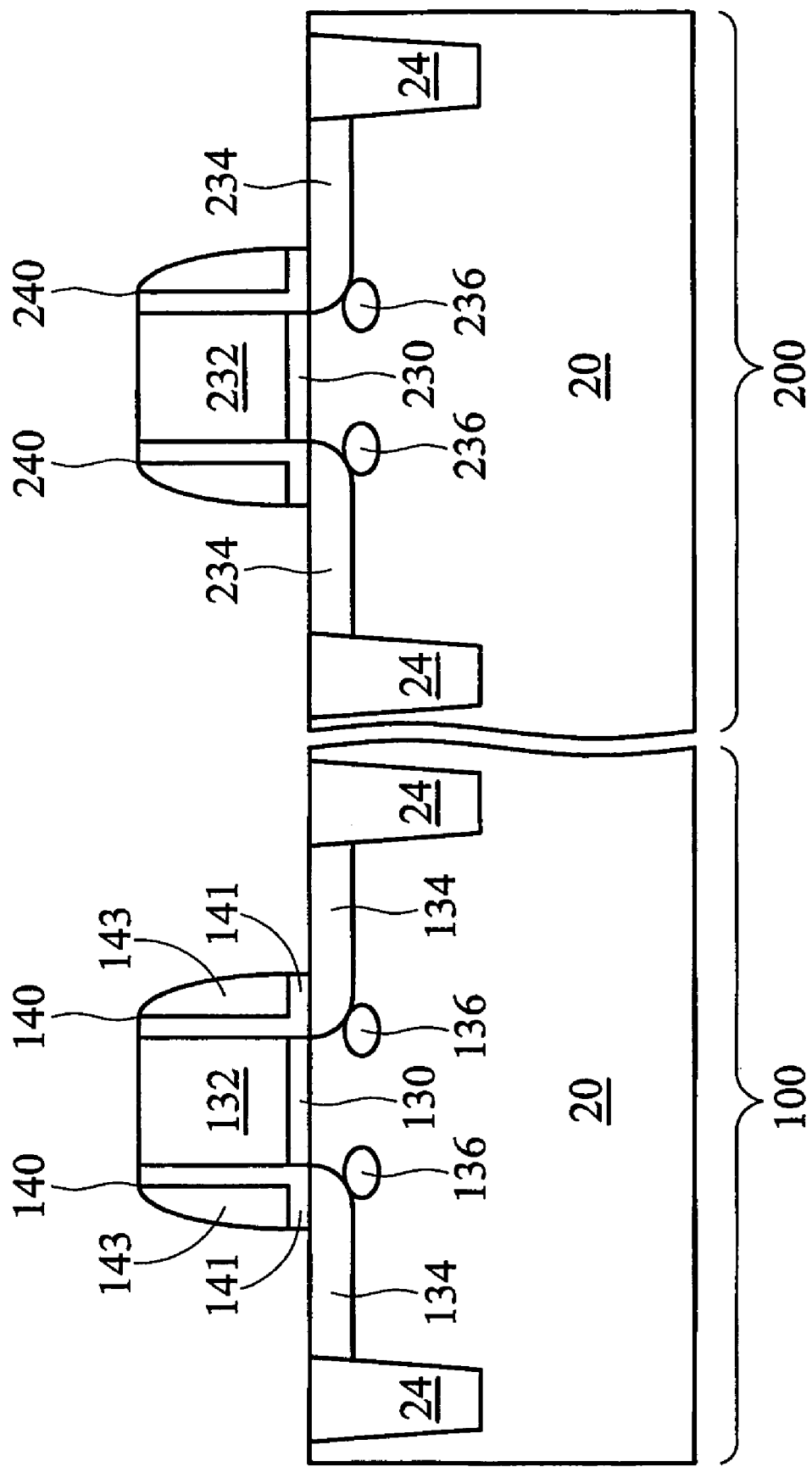
Figure 6B:
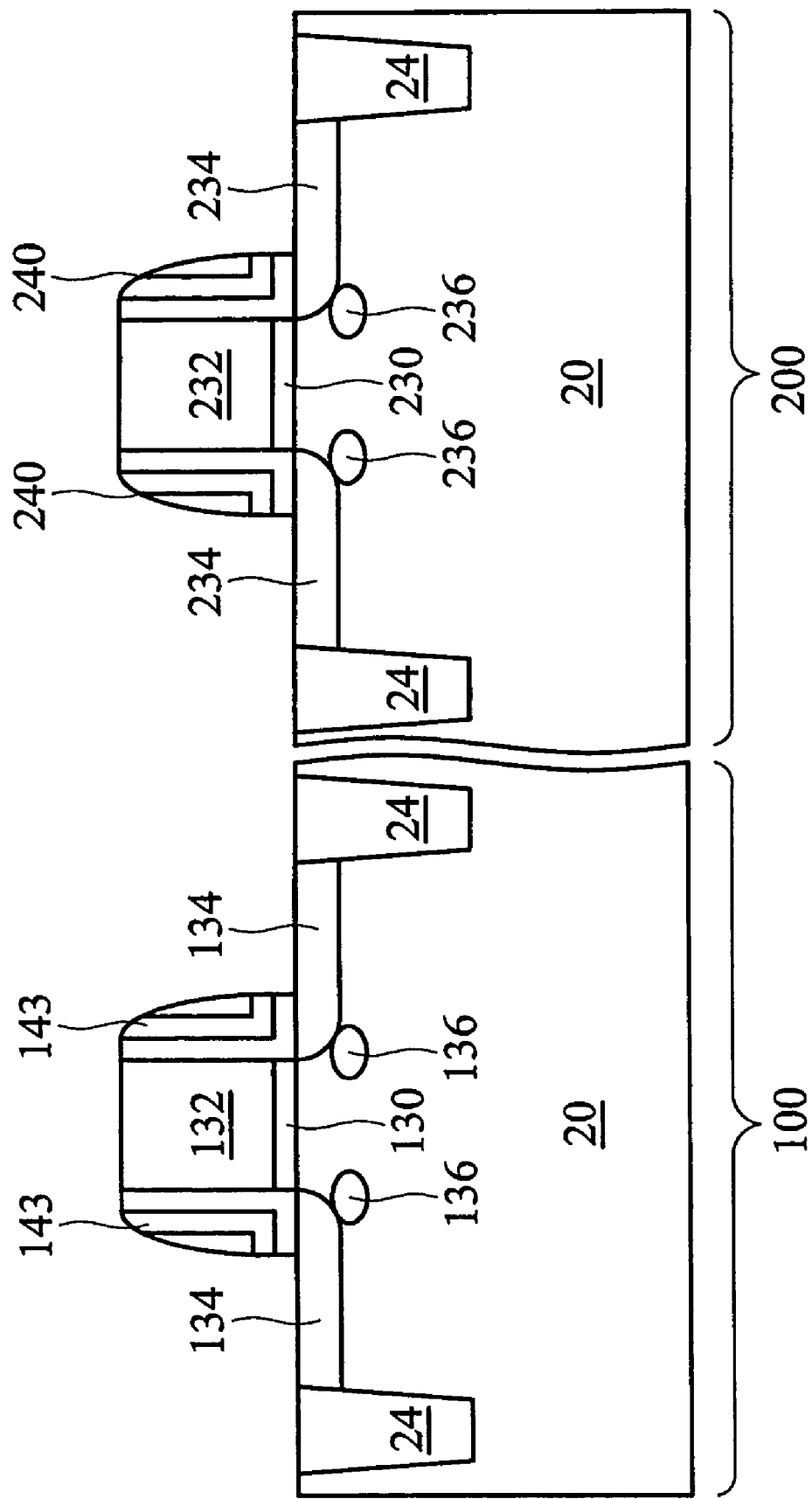

Gate spacers 140 and 240 are then formed, as shown in FIG. 6A and 6B The gate spacers may be formed by blanket forming a tunneling layer and a storage layer, and etching the stacked layers. Therefore, the gate spacers 140 and 240 have substantially the same thickness. The preferred spacer deposition methods include PECVD, LPCVD, sub-atmospheric chemical vapor deposition (SACVD), and the like.

The resulting spacers 140 include tunneling layers 141 and storages 143 on tunneling layers 141. Tunneling layer 141 may have a single-layer or a multi-layer structure. The preferred materials include silicon oxide, silicon oxynitride, high-k materials, and combinations thereof. Storages 143 preferably include dielectric materials having high charge-trapping densities, such as silicon nitride. Alternatively, high-k materials that can trap charges, such as $Al_2O_3$, $HfO_2$, HfON, ZrON, may also be used. In FIG. 6A, storages 143 are top layers of gate spacers 140. In FIG. 6B, gate spacers 140 are L-shaped and each further includes an additional dielectric layer, which may be an oxide layer, on storages 143. Since gate spacers 240 are simultaneously formed as the formation of gate spacers 140, they will have same structures.

Figure 7:
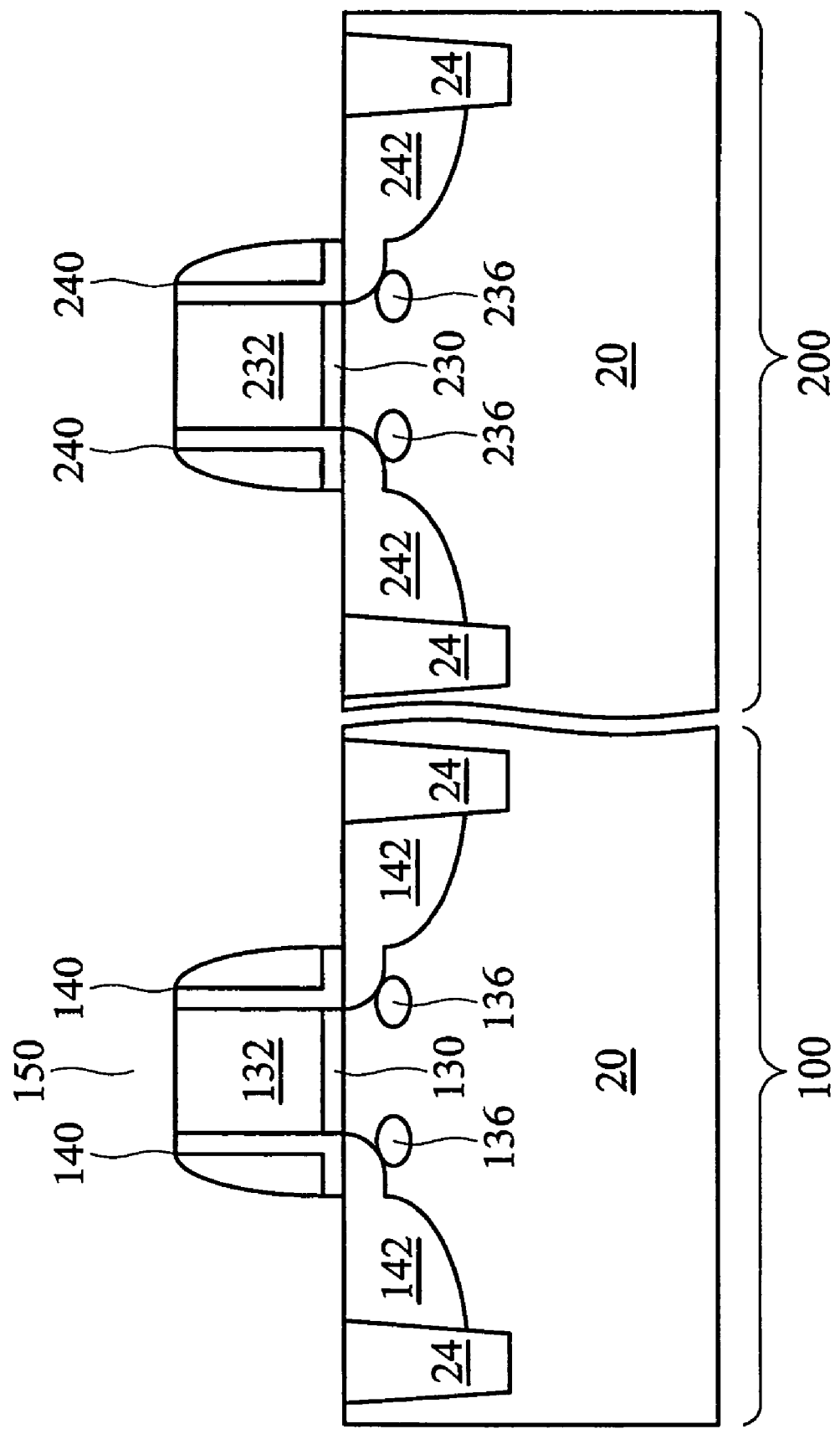

FIG. 7 illustrates the formation of deep source/drain regions 142 and 242, which are preferably formed by implanting n-type impurities. In the preferred embodiment, deep source/drain regions 142 and 242 are simultaneously formed. In other embodiments, deep source/drain regions 142 and 242 may be formed separately.

To finish the formation of MOS devices, silicide regions (not shown) are formed on exposed surfaces of deep source/drain regions 142 and 242, and possibly on gate electrodes 132 and 232, of the MOS devices. An etch stop layer (ESL) (not shown) and an inter-layer dielectric (ILD)(not shown) are then formed. The details for forming the silicide regions, the ESL and the ILD are well known in the art, thus are not repeated herein.

In the process steps discussed in preceding paragraphs, an n-type MOS (NMOS) memory cell 150 is formed in region 100. Alternatively, a p-type MOS (PMOS) memory cell (not shown) may be formed. Similar to the formation of NMOS memory cell 150, the gate stack, spacers, and deep source/drain regions of the PMOS memory cell may be formed simultaneously with the formation of the respective regions of a logic PMOS device. The process steps for forming the PMOS memory cell and the logic PMOS device are similar to what have been discussed in the preceding paragraphs, except that the conductivity types of LDD regions, pocket regions and deep source/drain regions are reversed. As is known in the art, the PMOS memory cell and the logic PMOS device may comprise silicon-germanium (SiGe) regions, whose formation is well known in the art, and thus is not repeated herein.

Figure 8:
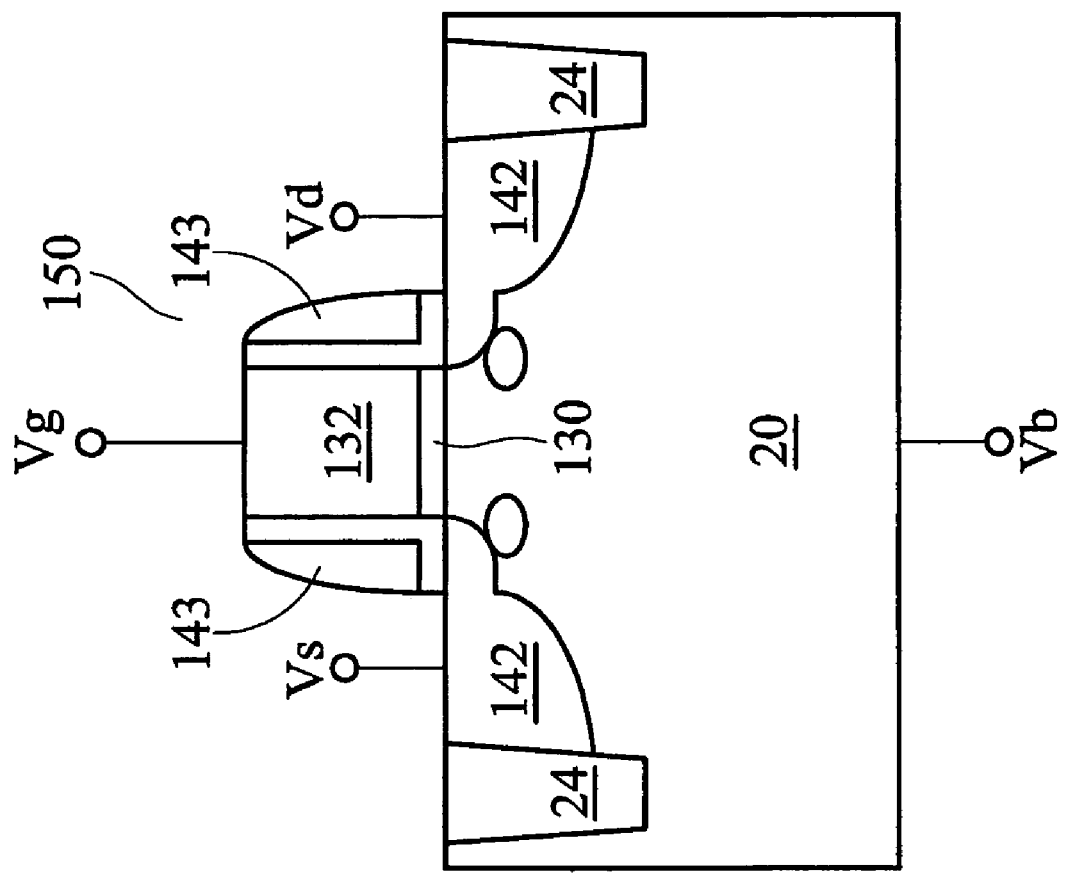
FIG. 8 illustrates the operations of a memory cell embodiment.

FIG. 8 illustrates the operation of memory cell 150. In an initial stage, memory cell 150 is not programmed, and storages 143 are substantially free from electrons (a "1" state). Accordingly, memory cell 150 exhibits a first threshold voltage Vt1. In a first embodiment, a gate voltage Vg, which is higher than drain voltage Vd, is applied on gate electrode 132. Deep source region 142 and substrate 20 are applied with relatively low voltages Vs and Vb, respectively. In an exemplary embodiment, voltages Vg, Vd, Vs and Vb are 7V, 4V, 0V and 0V, respectively. Electrons are thus programmed into storage 143 on the drain side. This causes the threshold voltage of the memory cell 150 to increase to Vt2. The respective state of memory cell 150 may be referred to as "0" state. When a read operation is performed to memory cell 150, a gate voltage, which is higher than threshold voltage Vt1 but lower than threshold voltage Vt2, may be applied to gate electrode 132. If memory cell 150 is on, it is determined that drain side storage 143 is not programmed with electrons. Conversely, if memory cell 150 is off, it is determined that drain side storage 143 is programmed with electrons.

Due to performance reasons, memory cell 150 is preferably used as a one-time programmable (OTP) memory cell, wherein only one program operation is performed. However, it can be used as a multiple-time programmable memory cell. To erase electrons from storages 143, drain region 142 may be applied with a voltage Vd higher than gate voltage Vg. Gate voltage can be a negative voltage. In an exemplary erase operation, voltages Vg, Vd, Vs and Vb are −4.5V, 5V, 1V and 1V, respectively. Electrons are thus erased out of storage 143 on the drain side, and the threshold voltage of memory cell 150 is lowered.

In a second embodiment for operating memory cell 150, holes, instead of electrons, are programmed and erased. To program holes into drain side storage 143, drain voltage Vd, which is higher than gate voltage Vg, is applied. The source region and substrate are applied with relatively low voltages Vs and Vb, respectively. In an exemplary embodiment, voltages Vg, Vd, Vs and Vb are −4V, 4V, 0V and 0V, respectively. Holes are thus programmed into drain side storage 143. This causes the threshold voltage of the memory cell 150 to be lowered to Vt3. When a read operation is performed to memory cell 150, a gate voltage, which is higher than threshold voltage Vt3 but lower than threshold voltage Vt1, may be applied to gate electrode 132. If memory cell 150 is on, it is determined that drain side storage 143 is programmed with holes. Conversely, if memory cell 150 is off, it is determined that holes have been erased from drain side storage 143.

To erase holes from storages 143, drain voltage Vd is preferably lower than gate voltage Vg, while substrate 20 and source 142 may be applied with relatively low voltages. In an exemplary erase operation, voltages Vg, Vd, Vs and Vb are 7V, 3.5V, 0V and 0V, respectively. Holes are thus erased out of storages 143. The threshold voltage of memory cell 150 is thus increased.

By increasing impurity concentrations in the LDD regions and pocket regions of the memory cells, the embodiments of the present invention will have reliable program/erase windows, which are the difference of threshold voltages before and after program operations. Experiments have been performed to thermal cycle sample devices formed using the preferred method. It has been found that after five baking cycles, the program/erase window reliably stays over 0.7V, wherein for each baking cycle, temperatures are increased to about 250° C. for about 12 hours, and then lowered to room temperature. In other experiments, the sample devices were baked at 250° C. for about 100 hours, and the program/ease window stays over 0.45V.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor structure comprising:
   a semiconductor substrate comprising a first region and a second region;
   a memory cell in the first region, the memory cell comprising:
      a first gate electrode over the semiconductor substrate;
      a first gate spacer on a sidewall of the first gate electrode, wherein the first gate spacer comprises a storage on a tunneling layer;
      a first lightly doped source or drain (LDD) region in the semiconductor substrate and having at least a portion under the first gate spacer; and
      a first pocket region in the semiconductor substrate and adjacent the first LDD region;
   a logic MOS device in the second region, the logic MOS device comprising:
      a second gate electrode over the semiconductor substrate;

a second gate spacer on a sidewall of the second gate electrode;

a second LDD region in the semiconductor substrate and having at least a portion under the second gate spacer; and a second pocket region in the semiconductor substrate and adjacent the second LDD region, wherein at least one of the first LDD region and the first pocket region has a higher impurity concentration than an impurity concentration of the respective second LDD region and the second pocket region.

2. The semiconductor structure of claim 1, wherein a ratio of the impurity concentration in the first pocket region to the impurity concentration in the second pocket region is greater than about 1.5.

3. The semiconductor structure of claim 2, wherein the ratio is greater than about 2.

4. The semiconductor structure of claim 1, wherein the first gate spacer has substantially a same thickness as the second gate spacer.

5. The semiconductor structure of claim 1, wherein the first gate electrode of the memory cell comprises a same structure and same materials as the second gate electrode of the logic MOS device.

6. The semiconductor structure of claim 1 further comprising a first source and drain region adjacent the first gate electrode and a second source and drain region adjacent the second gate electrode.

7. The semiconductor structure of claim 6, wherein the first and the second source and drain regions comprise a same impurity with substantially same impurity concentrations.

8. The semiconductor structure of claim 1, wherein the storage is L-shaped, and wherein the first gate spacer further comprises an additional dielectric layer on the storage.

9. The semiconductor structure of claim 1, wherein the storage comprises a dielectric material selected from the group consisting essentially of silicon nitride, silicon oxynitride, high-k materials, and combinations thereof.

10. A semiconductor structure comprising:
a semiconductor substrate comprising a first region and a second region;
a memory cell in the first region, the memory cell comprising:
a first gate electrode on the semiconductor substrate;
a first gate spacer on a sidewall of the first gate electrode, wherein the first gate spacer comprises a storage on a tunneling layer;
a first source/drain extension region in the semiconductor substrate and adjacent the first gate electrode, wherein the first source/drain extension region has a first impurity concentration; and
a first deep source/drain region in the semiconductor substrate and adjoining the first source/drain extension region; and
a logic MOS device in the second region, the logic MOS device comprising:
a second gate electrode on the semiconductor substrate, wherein the first and the second gate electrodes are separate portions of a same gate electrode layer;
a second gate spacer on a sidewall of the second gate electrode, wherein the first and the second gate spacers have substantially a same thickness;
a second source/drain extension region in the semiconductor substrate and adjacent the second gate electrode, wherein the second source/drain extension region has a second impurity concentration, and wherein the first impurity concentration is greater than the second impurity concentration; and
a second deep source/drain region in the semiconductor substrate and adjoining the second source/drain extension region, wherein the first and the second deep source/drain regions comprise a same impurity with substantially same impurity concentrations.

11. The semiconductor structure of claim 10, wherein the first impurity concentration is greater than about 1.5 times the second impurity concentration.

12. The semiconductor structure of claim 11, wherein the first impurity concentration is greater than about 2.0 times the second impurity concentration.

13. The semiconductor structure of claim 10, wherein the memory cell comprises a first pocket region and the logic MOS device comprises a second pocket region, and wherein an impurity concentration in the first pocket region is greater than an impurity concentration in the second pocket region.

* * * * *